United States Patent
Tanaka et al.

(10) Patent No.: US 7,393,764 B2
(45) Date of Patent: Jul. 1, 2008

(54) LASER TREATMENT APPARATUS, LASER TREATMENT METHOD, AND MANUFACTURING METHOD OF SEMICONDUCTOR DEVICE

(75) Inventors: Koichiro Tanaka, Isehara (JP); Yoshiaki Yamamoto, Hadano (JP); Takatsugu Omata, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 343 days.

(21) Appl. No.: 11/274,272

(22) Filed: Nov. 16, 2005

(65) Prior Publication Data

US 2006/0141754 A1    Jun. 29, 2006

(30) Foreign Application Priority Data

Nov. 29, 2004    (JP) .............................. 2004-343250

(51) Int. Cl.
*H01L 21/20* (2006.01)
(52) U.S. Cl. .................. 438/487; 438/149; 438/486; 257/E21.134; 257/E21.347; 257/E21.475
(58) Field of Classification Search .......... 257/E21.517, 257/E21.471, E21.472, E21.475
See application file for complete search history.

(56) References Cited

U.S. PATENT DOCUMENTS 6,849,825 B2 *    2/2005    Tanaka .................. 219/121.82
2004/0041158 A1 *    3/2004    Hongo et al. .................. 257/79

FOREIGN PATENT DOCUMENTS

| JP | 09-174264 | 7/1997 |
| JP | 10-263866 | 10/1998 |
| JP | 2001-018079 | 1/2001 |
| JP | 2003-126977 | 5/2003 |

* cited by examiner

*Primary Examiner*—Michael S. Lebentritt
*Assistant Examiner*—Cheung Lee
(74) *Attorney, Agent, or Firm*—Eric J. Robinson; Robinson Intellectual Property Law Office, P.C.

(57) ABSTRACT

The invention relates to a laser treatment apparatus including a laser oscillator, an interlock provided in the laser oscillator, a movable table which moves with a certain movement period, a timer, an interlock provided in the timer, a sensor which can detect movement of the movable table, and a computer, in which the timer starts measuring time when the sensor senses passage of the movable table, and when the movable table does not pass the sensor even after the movement period, conduction between contacts of the interlock provided in the timer is blocked to operate the interlock in the laser oscillator, thereby stopping laser output. The invention also relates to a laser treatment method using the laser treatment apparatus.

8 Claims, 9 Drawing Sheets

LASER TREATMENT APPARATUS, LASER TREATMENT METHOD, AND MANUFACTURING METHOD OF SEMICONDUCTOR DEVICE

BACKGROUND OF THE INVENTION

1. Field of the Invention

The present invention relates to a laser light irradiation method and a laser treatment apparatus for laser light irradiation. The invention also relates to a method for manufacturing a semiconductor device using laser light irradiation.

2. Description of the Related Art

A laser treatment apparatus which performs various kinds of processing by laser light irradiation and a laser light irradiation method have been known.

One feature of using laser light is that only a region which is irradiated with laser light and absorbs energy thereof can be selectively heated unlike in the case of heat treatment using radiation heating or conduction heating. For example, laser treatment using an excimer laser oscillator, which oscillates ultraviolet light having a wavelength of 400 nm or less, heats a semiconductor film selectively and locally, and achieves crystallization or activation of the semiconductor film with little thermal damage to a glass substrate.

Figure 2A:
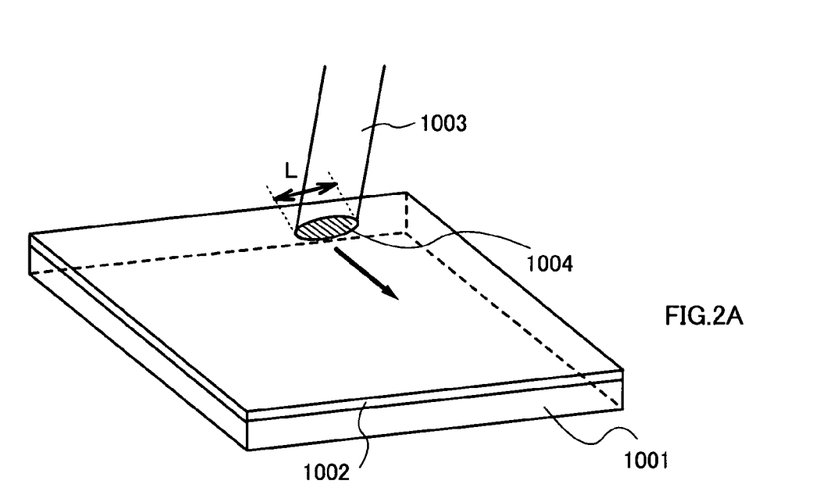
FIGS. 2A to 2C show a conventional laser treatment apparatus.
Figure 2B:
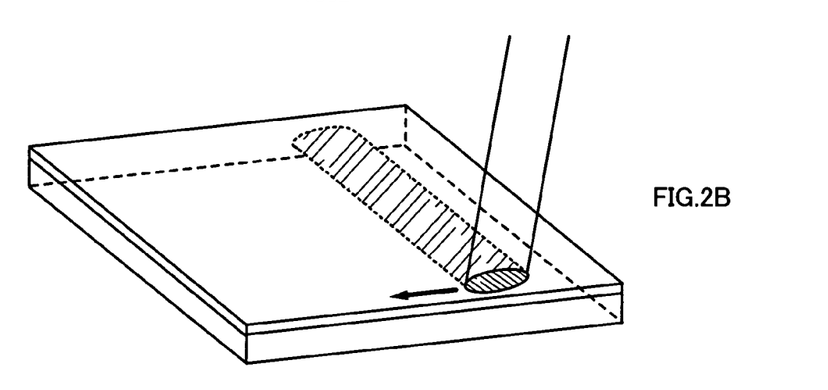
Figure 2C:
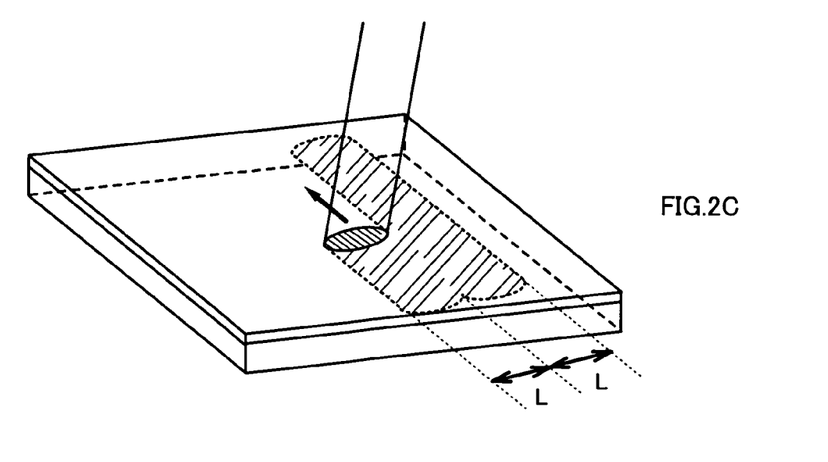

A method for laser-annealing a semiconductor film formed over a large-size glass substrate with a linear laser is explained as an example of the laser light treatment apparatus and the laser light irradiation method with reference to FIGS. 2A to 2C. First, a semiconductor film 1002 formed over a substrate 1001 is scanned by a linear laser 1003, whose beam spot 1004 has a longitudinal length L of several hundred micrometers, in a width direction of the linear laser (in the direction of an arrow in FIG. 2A). Then, a region of several hundred micrometers in the semiconductor film 1002 is laser-annealed (FIG. 2A). Subsequently, the linear laser 1003 is translated (is moved) by as much as the longitudinal length L of the linear laser 1003 (FIG. 2B), and the semiconductor film 1002 is scanned again by the linear laser 103 in a width direction (FIG. 2C). By repeating this process several hundred to thousand times, the semiconductor film 1002 formed over the large-size substrate 1001 can be entirely laser-annealed.

FIGS. 2A to 2C show the case of using a linear laser. In the case of shaping a continuous wave laser beam converted into a harmonic into a linear laser, a longitudinal length of the linear laser needs to be as extremely short as several hundred micrometers to obtain a power density sufficient to laser-anneal a semiconductor film. Therefore, in the case of entirely laser-annealing a semiconductor film formed over a large-size glass substrate, for example, a glass substrate having a side of approximately one meter, the substrate needs to be placed on a movable table such as an XY stage which can be moved right to left and up and down, and the movable table provided with the substrate needs to be reciprocated several hundred to thousand times.

Note that, in this specification, a direction of a longer axis of a linear laser is referred to as a long-axis direction or a longitudinal direction, and a direction of a shorter axis of a linear laser is referred to as a short-axis direction or a width direction.

Meanwhile, an injury, a fire, and the like are major disasters which occur in performing laser annealing. When a combustible material is irradiated with laser light, the combustible material has possibility of igniting by absorbing the laser light and generating heat. Therefore, especially against a fire, it is very important to take preventive measures in advance (Reference 1: Japanese Patent Laid-Open No. 9-174264, Reference 2: Japanese Patent Laid-Open No. 10-263866, Reference 3: Japanese Patent Laid-Open No. 2001-18079, and Reference 4: Japanese Patent Laid-Open No. 2003-126977).

It is an object of the present invention to safely perform laser annealing without irradiating an unintended region with laser light so as not to cause a disaster even when an unusual situation is brought about in performing laser annealing.

A disaster such as a fire in performing laser annealing is thought to be caused by an abnormal stop of a stage which moves a substrate (for example, an XY stage), vibration of an apparatus due to an earthquake or the like, generation of an abnormal gas, generation of smoke, a change in an optical system such as a mirror due to high heat, or the like.

When a stage is abnormally stopped at an unexpected position during laser annealing, a portion below an intended irradiation position may ignite, or a portion therearound may ignite due to reflected light from an unspecified position or the like, which is very dangerous. As a cause of a stage stop at an unexpected position, freeze (abnormal stop) of a system control computer (for example, a personal computer (PC)), abnormality in communication between a PLC and a PC, a malfunction of an electronic device due to noise from outside, or the like can be given.

When an optical element such as a mirror falls or a reflection angle or an incident angle is changed due to apparatus vibration caused by an earthquake or the like, a portion different from a portion normally irradiated with laser light is irradiated with the laser light. Therefore, the portion may ignite.

SUMMARY OF THE INVENTION

It is an object of the present invention to provide a laser treatment apparatus and a laser treatment method which do not cause a disaster such as a fire even when an abnormal stop, a malfunction, or the like occurs.

One feature of the invention is an integrated system and an integrated apparatus of a system which stops laser output using a PC when a stage is abnormally stopped during laser annealing for some reason, a system which stops laser output using not the PC but another system when a stage is similarly abnormally stopped and the PC is frozen (abnormally stopped) during laser annealing, and a system which stops laser output due to apparatus vibration caused by an earthquake or the like.

The present invention relates to a laser treatment apparatus comprising: a laser oscillator; a first interlock provided in the laser oscillator; a movable table which moves with a certain movement period; a timer; a second interlock provided in the timer; and a sensor which can detect movement of the movable table, wherein the timer starts measuring time when the sensor senses passage of the movable table, and when the movable table does not pass the sensor even after the movement period, conduction between contacts of the second interlock provided in the timer is blocked to operate the first interlock in the laser oscillator, thereby not irradiating a substrate over the movable table with laser light.

The present invention also relates to a laser treatment method, using a laser treatment apparatus including a laser oscillator, a first interlock provided in the laser oscillator, a movable table which moves with a certain movement period, a timer, a second interlock provided in the timer, and a sensor which can detect movement of the movable table, the method comprising the steps of: placing a substrate over the movable table; annealing a semiconductor film formed over the substrate with laser light; starting measuring time with the timer when the sensor senses passage of the movable table; and blocking conduction between contacts of the second interlock provided in the timer when the movable table does not pass the sensor even after the movement period to operate the first interlock in the laser oscillator, thereby not irradiating the substrate over the movable table with the laser light.

The present invention further relates to a method for manufacturing a semiconductor device, comprising the steps of: forming a base film over the substrate; forming the semiconductor film over the base film; crystallizing the semiconductor film by irradiating the semiconductor film with the linear laser formed by the laser treatment apparatus to form a crystalline semiconductor film; patterning the crystalline semiconductor film to form an island-shaped semiconductor film; forming a gate insulating film and a gate electrode over the island-shaped semiconductor film; and adding an impurity which imparts one conductivity to the island-shaped semiconductor film to form a source region, a drain region, and a channel formation region.

In the present invention, the laser treatment apparatus is provided with a programmable logic controller (PLC).

The programmable logical controller (hereinafter referred to as a PLC) is used to control a position of an XY stage. The PLC has a function of ordering a driver for producing an electric signal necessary for driving the XY stage to output the electric signal. The order to move the stage is sent from a computer, for example, a personal computer (hereinafter referred to as a PC) to the PLC by communication.

The PC can also be employed to control output of the laser oscillator because many laser oscillators themselves have functions of communicating with the PC. Therefore, the present invention can employ a crystallization method in which the laser oscillator and the PC are interacted with each other.

In the present invention, the linear laser is a continuous wave laser.

In the present invention, the linear laser is a pulsed laser with a frequency of 10 MHz or more.

In the present invention, the linear laser is a pulsed laser with a frequency of 80 MHz or more.

In the present invention, the continuous wave laser is any one of an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, and a helium-cadmium laser.

In the present invention, the pulsed laser is any one of an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, and a gold vapor laser.

In the present invention, the substrate is any one of a glass substrate, a quartz substrate, a stainless-steel substrate, and a substrate formed of a synthetic resin.

Note that the term "semiconductor device" used herein refers to a device in general that can be operated by utilizing semiconductor characteristics, and an electro-optical device, an electrical device, a semiconductor circuit, and an electronic device are all included in the semiconductor device.

Note that the present invention can be applied to any laser treatment apparatus and laser irradiation method in a field related to a laser processing technique.

According to the invention, laser output can be automatically stopped when a stage of a laser treatment apparatus is abnormally stopped or the apparatus is vibrated by an earthquake or the like. Thus, a disaster such as a fire can be prevented. Further, a similar effect can be obtained also when a PC which controls stage movement or laser output is frozen (abnormally stopped).

DETAILED DESCRIPTION OF THE INVENTION

Figure 3:
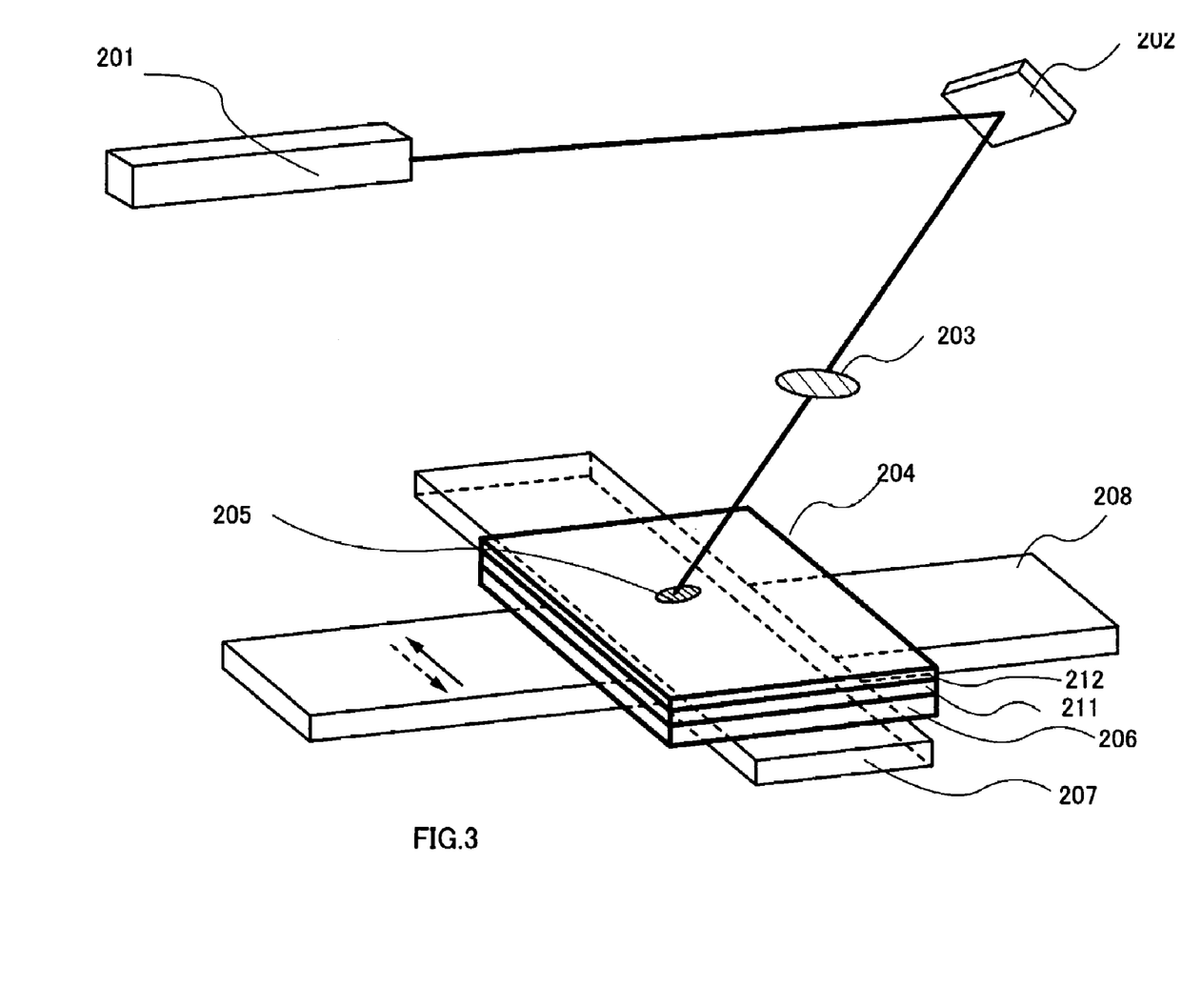
FIG. 3 shows a laser treatment apparatus of the present invention.

Embodiment Mode is explained with reference to FIGS. 1 and 3. Note that the present invention can be carried out in many different modes. As is easily known to a person skilled in the art, the mode and the detail of the invention can be variously changed without departing from the purpose and the scope of the present invention. Therefore, the invention is not limited to the description of this embodiment mode.

Figure 1:
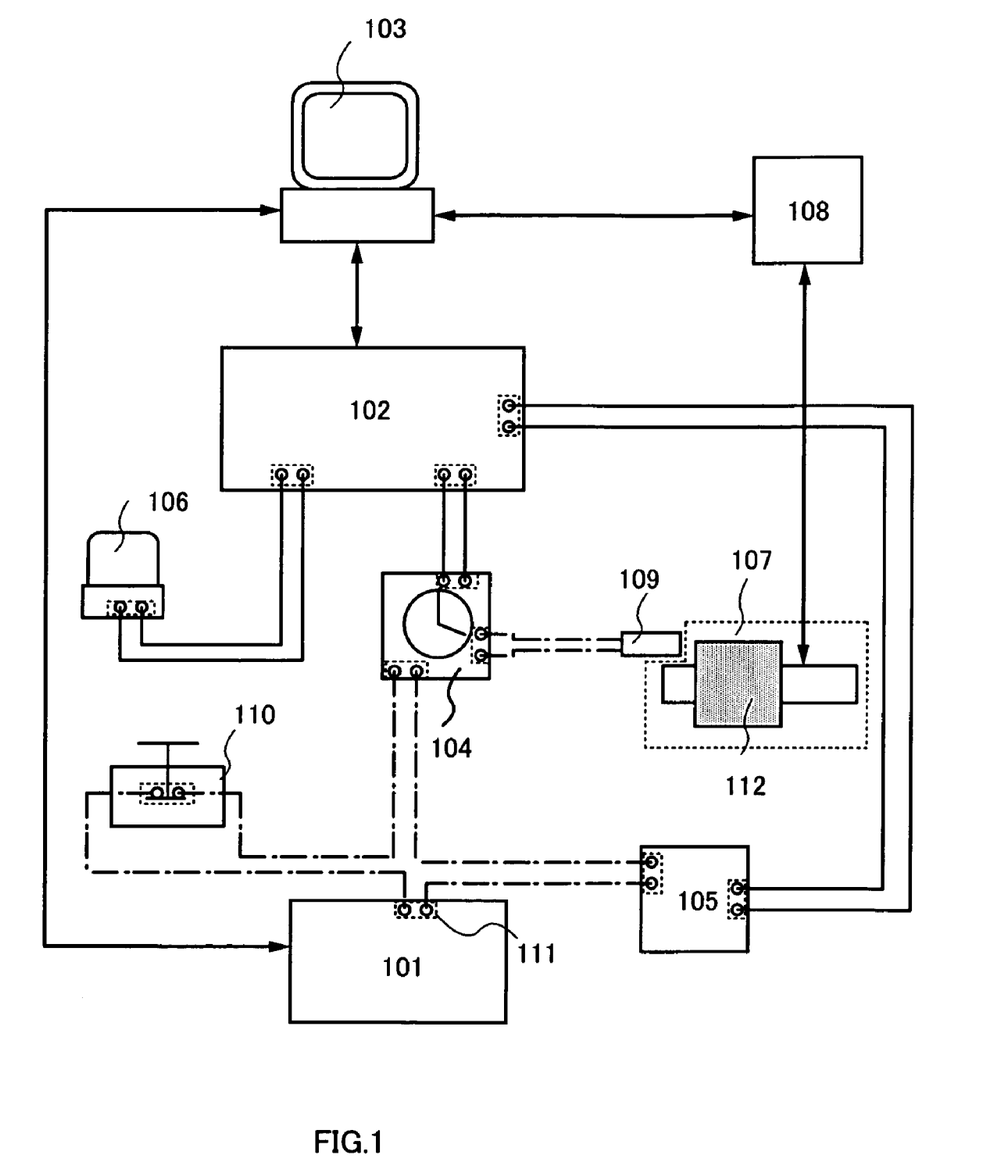
FIG. 1 shows a laser treatment apparatus of the present invention.

A laser treatment apparatus in FIG. 1 is explained. Note that solid lines in the diagram represent power wirings among devices included in the laser treatment apparatus, and one-dot chain lines represent connection wirings. In addition, arrow lines represent command lines of a PC.

In FIG. 1, reference numeral 101 denotes a laser oscillator; 102, a switch box; 103, a personal computer (PC); 104, a timer; 105, a seismic sensor; 106, a warning light; 107, an XY stage; 108, a programmable logic controller (PLC); 109, a sensor; 110, a manual emergency stop button; 111, an interlock; and 112, a movable table.

In order to stop oscillation of the laser oscillator 101, the interlock 111 incorporated in the laser oscillator or attached to a power supply portion of the laser oscillator is used. The interlock 111 operates, when two contacts which generally conduct electricity are opened, to stop laser output by turning off the oscillator or closing a mechanical shutter provided in the oscillator. The switch box 102 has a function of communicating with the PC 103, and can turn on and off a switch under an order from the PC 103. The timer 104 has a function of controlling conduction. Conduction is blocked after a predetermined period. The timer 104 preferably starts measuring time using the sensor 109 which can detect movement of the movable table 112 mounted on the XY stage 107. The seismic sensor 105 refers to one having a function of controlling conduction as the timer 104 has and blocking conduction when it senses vibration. The warning light 106 has a function of notifying a person therearound that a laser is being oscillated.

First, a procedure for starting laser annealing is explained.

When the PC 103 orders the stage 107 to start moving, the stage 107 moves to a movement start position for a first line. After the stage 107 moves to the movement start position, the PC 103 orders the switch box 102 to light the warning light 106 which notifies a person therearound that a laser is being oscillated, and the warning light 106 is then turned on. Lastly, the PC 103 orders the laser oscillator 101 to output a laser. Then, a laser is outputted. After the laser output, the stage 107 starts moving.

Here, a method for annealing a semiconductor film formed over a substrate with a linear laser is explained with reference to FIG. 3. First, laser light emitted from a laser oscillator 201 is processed into a linear laser as follows. The laser light emitted from the laser oscillator 201 (101 in FIG. 1) is reflected by a mirror 202 and enters a planoconvex lens 203 provided parallel to a substrate 211. When the laser light is made to enter the planoconvex lens 203 at a certain incident angle (not 0°), a beam spot 205 of the laser light on an irradiation surface is elongated only in an incident direction due to lens astigmatism, and the laser light becomes a linear laser.

At this time, by making the linear laser narrower, a longer beam spot of the linear laser can be obtained. It is preferable to move the beam spot in a short-axis direction of this linear laser because a wider region can be crystallized at a time and productivity is good.

Note that an optical system used herein is not limited to the above-described optical system. Any optical system that can shape laser light into a linear shape can be used. An optical system in which plural, for example, two cylindrical lenses are combined, a diffractive optical element, or the like can be used in place of the optical system in this embodiment mode.

The diffractive optical element is an element for obtaining a spectrum utilizing diffraction of light, and an element serving as a condensing lens by forming a number of grooves on its surface is used.

Next, a method for laser-annealing a semiconductor film by making a linear laser scan the semiconductor film is explained. Note that the substrate 211, the linear laser, and the beam spot 205 thereof move in almost the same manner as shown in FIG. 2; therefore, FIG. 2 may be referred to.

The substrate 211 provided with a semiconductor film 212 is placed over a movable table 206 (112 in FIG. 1), and the movable table 206 is provided over a Y-axis stage 207 and an X-axis stage 208 (the XY stage 107 in FIG. 1) which can be moved at 400 mm/sec or less. The Y-axis stage 207 moves in a short-axis direction of the beam spot 205 of the linear laser, and the X-axis stage 208 moves in a long-axis direction of the beam spot 205 of the linear laser. After the Y-axis stage 207 moves in the direction of an arrow indicated by a solid line (outward), the X-axis stage 208 moves by as much as a longitudinal length (L in FIG. 2) of the beam spot. Subsequently, the Y-axis stage 207 moves in the direction of an arrow indicated by a dotted line (homeward), and the X-axis stage 208 moves again by as much as a longitudinal length of the beam spot. The entire surface of the substrate can be laser-annealed by repeating this operation.

Here, explained is the case where the stage 107 is abnormally stopped due to an unexpected situation, for example, noise from outside during normal operation of the PC 103.

When the stage 107 is abnormally stopped, the stage 107 cannot move to a target position. Therefore, the PLC 108 becomes incapable of controlling a position of the stage 107. In the case where the PC 103 operates normally at the time, a signal indicating abnormality is transmitted from the PLC 108 to the PC 103, and an order to stop laser output is sent from the PC 103 to the laser oscillator 101. Thus, laser output is stopped.

Subsequently, considered is the case where the stage 107 is abnormally stopped during treatment and the PC 103 is frozen (abnormally stopped) at the same time, or the case where the stage 107 is abnormally stopped and the PC 103 cannot receive the signal indicating abnormality from the PLC 103 and cannot send the order to stop laser output.

When normal laser annealing is performed, the stage 107 is repeatedly reciprocated at an appropriately determined speed. Therefore, reciprocation of the movable table 112 placed over the stage 107 is constantly performed with a predetermined period t. In this embodiment mode, t is in the range of 2 to 10 seconds, preferably, 6 seconds.

Immediately before the movable table 112 starts moving after the laser is outputted, an order to power on the timer 104 is sent from the PC 103 to the switch box 102. The timer 104 starts measuring time when the sensor 109 which is fixed to a component different from the movable table 112 senses passage of the movable table 112.

Figure 8:
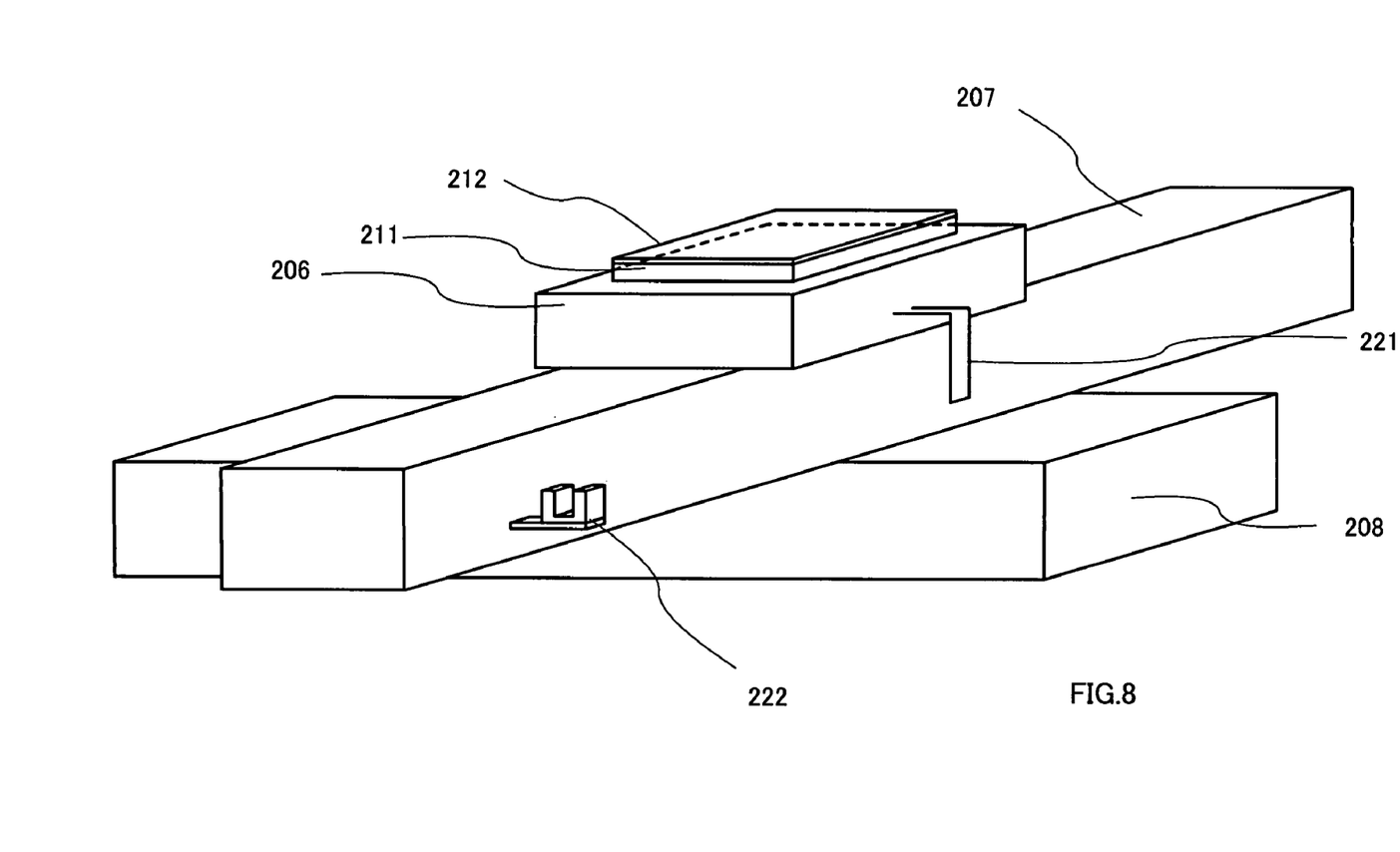
FIG. 8 shows a laser treatment apparatus of the present invention.

FIG. 8 shows an example in which the stage 107 (the Y-axis stage 207 and the X-axis stage 208 in FIG. 2) is provided with the sensor 109. Note that, in FIG. 8, the same reference numeral is used to denote the same component as that in FIGS. 1 and 2.

In FIG. 8, the Y-axis stage 207 is provided with a sensor 222 (109 in FIG. 1), and the movable table 206 (112 in FIG. 1) is provided with a shield 221.

In this embodiment mode, a photomicrosensor is used as the sensor 222. When the shield 221 passes the photomicrosensor 222, it interrupts light and the photomicrosensor 222 senses movement of the movable table 206. Accordingly, a signal is sent from the photomicrosensor 222 to the timer 104, and the timer 104 starts measuring time.

When the PC 103 and the PLC 108 operate normally, the PC 103 can order the laser oscillator 101 to stop output even if the stage 107 is abnormally stopped. In addition, as described above, even if the PLC 108 cannot control a position of the stage 107, the PC 103 can order the laser oscillator 101 to stop output when the PC 103 operates.

Here, considered is the case where the stage 107 is abnormally stopped during laser annealing and movement periodicity of the movable stage 112 is lost, for example, the case where the stage 107 is abnormally stopped during laser annealing and the PC 103 is frozen (abnormally stopped).

If the stage 107 is abnormally stopped and the PC 103 is frozen, the laser oscillator 101 cannot be ordered to stop output. Therefore, laser output cannot be stopped.

However, the timer 104 operates with a totally different communication system from that of the PC 103 and the PLC 108. Therefore, laser output can be stopped even when the PC 103 is frozen.

In the case where the movable table 112 is abnormally stopped and does not pass the sensor 109 (there is no input signal) even after the movement period t, conduction between contacts of the interlock provided in the timer 104 in which the period t is set is blocked. Consequently, the interlock in the laser oscillator 101 can be operated to stop laser output.

Further, when the apparatus is vibrated due to an earthquake or the like, the vibration can be sensed by the seismic sensor 105 and laser output can be stopped. In other words, an order to power on the seismic sensor 105 is sent from the PC 103 to the switch box 102 as in the case of the timer 104. Here, conduction between contacts is blocked when the seismic sensor 105 senses vibration. Consequently, the interlock in the laser oscillator 101 can be operated to stop laser output. This makes it possible to perform laser annealing more safely.

In addition, it is preferable to provide the manual emergency stop button 110 with which an operator can manually stop output when realizing abnormality. The manual emergency stop button 110 preferably uses a B contact switch which is generally in a conductive state and is put in a non-conductive state when the switch operates to open contacts.

Thus, laser output can be stopped in an abnormal situation if at least one of the timer 104, the manual emergency stop button 110, and the seismic sensor 105 normally operates. In particularly, laser output can be stopped more surely because the timer 104 which operates with a totally different communication system from that of the PC 103 and the PLC 108 is provided. Accordingly, even when there is an abnormality, laser output can be safely stopped and a disaster such as a fire can be prevented.

Figure 9:
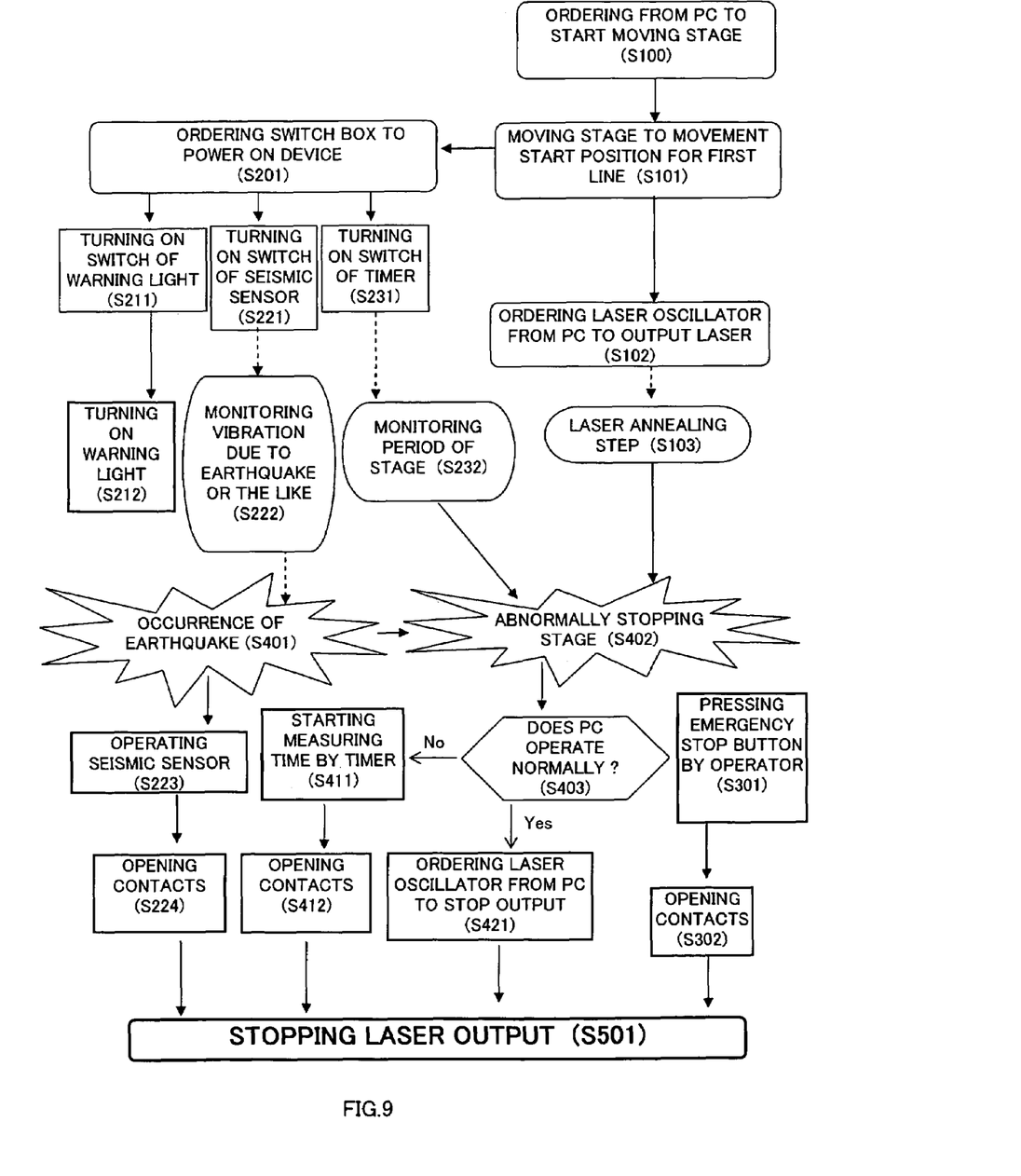
FIG. 9 is a flowchart showing a method for operating a laser treatment apparatus of the present invention.

FIG. 9 is a flowchart of a method for operating the above-described laser treatment apparatus. Note that time passes from the top to the bottom of the paper in FIG. 9. First, when an order to start moving is sent from the PC 103 to the stage 107 (Step 100 (S100)), the stage 107 moves to a movement start position for a first line (Step 101 (S101)). Then, the switch box 102 is ordered to power on the timer 104, the seismic sensor 105, and the warning light 106 (Step 201 (S201)), and switches of the devices are turned on (Step 231 (S231), Step 221 (S221), and Step 211 (S211), respectively). When the warning light 106 is turned on, the warning light 106 lights (Step 212 (S212)).

After the stage 107 moves to the movement start position for the first line (Step 101 (S101)), the PC 103 orders the laser oscillator 101 to output a laser (Step 102 (S102)), and laser annealing is started (Step 103 (S103)). The timer 104 monitors a movement period of the stage 107 (Step 232 (S232)), and the seismic sensor 105 monitors apparatus vibration due to an earthquake or the like (Step 222 (S222)).

Here, considered is the case where the stage 107 is abnormally stopped (Step 402 (S402)). The abnormal stop of the stage 107 is thought to be caused by freeze (abnormal stop) of the PC, an earthquake, or the like. When the stage 107 is abnormally stopped due to vibration caused by occurrence of an earthquake (Step 401 (S401)), the seismic sensor 105 operates (Step 223 (S223)) to open contacts of the interlock provided in the seismic sensor 105 (Step 224 (S224)), and laser output is stopped (Step 501 (S501)).

If the PC 103 operates normally (Step 403 (S403)) in the case where the stage 107 is abnormally stopped (Step 402 (S402)) due to a cause other than an earthquake, the PC 103 orders the laser oscillator 101 to stop output (Step 421 (S421)), and laser output is stopped (S501).

If the PC 103 operates normally even when an earthquake is the cause, the PC 103 may order the laser oscillator 101 to stop output, and laser output may thus be stopped.

Considered is the case where the stage 107 is abnormally stopped (S402) due to a cause other than an earthquake and the PC 103 does not operate normally (S403). Because the stage 107 is abnormally stopped, the timer 104 in which the period t is set starts measuring time (Step 411 (S411)) to open contacts of the interlock in the timer 104 (Step 412 (S412)), and laser output is stopped (S501).

If the stage 107 is abnormally stopped and the PC 103 does not normally operate even when an earthquake is a cause, the timer 104 may start measuring time to open the contacts of the interlock in the timer 104, and laser output may be stopped.

When the laser treatment apparatus is put in an unusual situation, an operator can stop laser output (S501) by pressing the manual emergency stop button 110 (Step 301 (S301)) to open the contacts of the interlock (Step 302 (S302)).

As described above, the stage 107 is monitored by a plurality of devices such as the timer 104, the seismic sensor 105, and the warning light 106 while the stage 107 operates. In addition, the operator can stop laser output with the manual emergency stop button 110 if necessary. Therefore, the laser treatment apparatus can be safely used.

Note that the present invention is not limited to the description in this embodiment mode and can be applied to any laser treatment apparatus and laser irradiation method in a field related to a laser processing technique.

Embodiment 1

In this embodiment, a method for manufacturing a semiconductor device using the laser treatment apparatus of the invention is explained with reference to FIGS. 4A to 4D, 5A to 5C, and 6A to 6C.

Figure 4A:
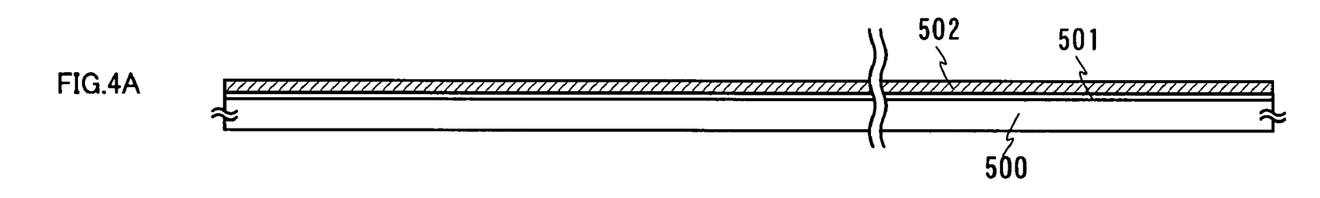
FIGS. 4A to 4D show a manufacturing process of a semiconductor device of the present invention.

First, as shown in FIG. 4A, a base film 501 is formed over a substrate 500. As the substrate 500, a glass substrate of, for example, barium borosilicate glass, aluminoborosilicate glass, or the like, a quartz substrate, a stainless-steel substrate, or the like can be used. A substrate made of a synthetic resin having flexibility such as acrylic or plastic typified by PET, PES, or PEN can alternatively be used.

The base film 501 is provided to prevent alkali metal such as Na and alkaline earth metal contained in the substrate 500 from diffusing into a semiconductor film and adversely affecting characteristics of a semiconductor element. Therefore, the base film 501 is formed using an insulating film of silicon oxide (SiO), silicon nitride (SiN), silicon oxide containing nitrogen (SiON), or the like, which can suppress diffusion of alkali metal or alkaline earth metal into a semiconductor film. In this embodiment, a silicon oxide film containing nitrogen is formed with a thickness of 10 nm to 400 nm (preferably, 50 nm to 300 nm) by a plasma CVD method.

Note that the base film 501 may be a single layer or a laminated layer of a plurality of insulating films. In the case of using a substrate containing even a small amount of alkali metal or alkaline earth metal, such as a glass substrate, a stainless-steel substrate, or a plastic substrate, it is effective to provide the base film from the standpoint of prevention of impurity diffusion. However, when the impurity diffusion does not become a significant problem, for example, when a quartz substrate or the like is used, the base film is not necessarily provided.

Next, a semiconductor film 502 is formed over the base film 501. A thickness of the semiconductor film 502 is in the range of 25 nm to 100 nm (preferably, 30 nm to 60 nm). The semiconductor film 502 may be either an amorphous semiconductor or a polycrystalline semiconductor. As the semiconductor, silicon germanium as well as silicon can be used. In the case of using silicon germanium, a concentration of germanium is preferably in the range of approximately 0.01 atomic % to 4.5 atomic %.

Figures 4B, 4C:
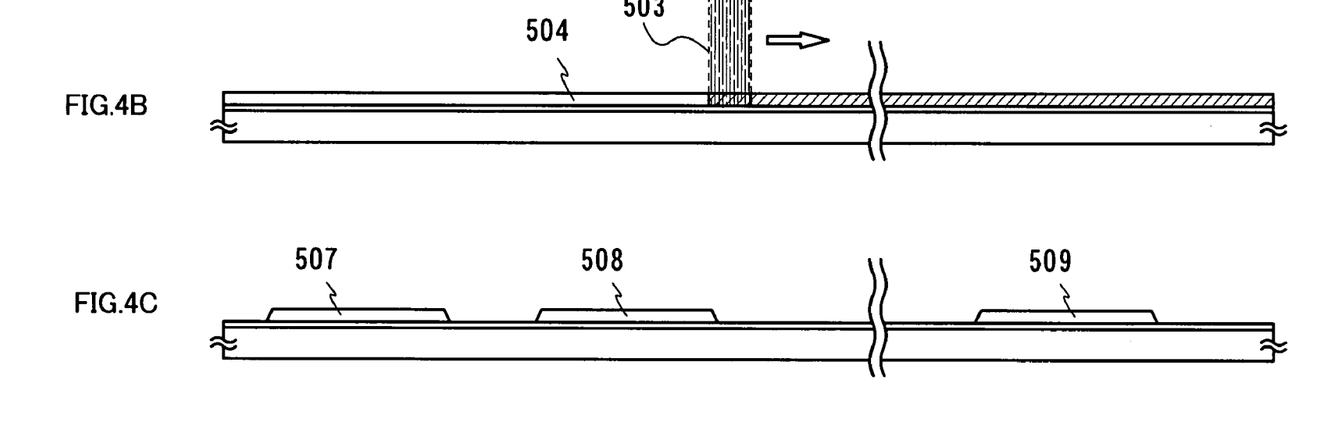

Next, as shown in FIG. 4B, the semiconductor film 502 is irradiated with laser light (laser beam) 503 for crystallization with the use of the laser treatment apparatus of the present invention.

Note that a laser treatment apparatus and a laser crystallization method with laser irradiation, which are employed in this embodiment, are similar to those described in Embodiment Mode.

Thus, the laser treatment apparatus shown in FIG. 1 is used and conduction between contacts of the timer 104 is blocked when the movable table 112 which moves with a period t is abnormally stopped. Consequently, the interlock in the laser oscillator 101 can be operated and laser output can be stopped safely.

In addition, the seismic sensor 105 senses vibration and the interlock in the laser oscillator is then operated. Consequently, laser output can be stopped. Furthermore, laser output can be manually stopped with the manual emergency stop button 110.

In the case of performing laser crystallization, heat treatment at 500° C. for one hour may be performed on the semiconductor film 502 before the laser crystallization in order to increase resistance of the semiconductor film 502 against the laser.

In the laser crystallization, a continuous wave laser or a pulsed laser with a repetition rate of 10 MHz or more, preferably, 80 MHz or more, can be used.

Specifically, as the continuous wave laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, or the like can be used.

When pulse oscillation can be performed at a repetition rate of 10 MHz or more, preferably 80 MHz or more, a pulsed laser such as an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, or a gold vapor laser can be used.

Such a pulsed laser eventually shows a similar effect to the continuous wave laser when a repetition rate is increased.

For example, in the case of using a solid-state laser capable of continuous wave oscillation, a crystal with a large grain size can be obtained by irradiating the semiconductor film with laser light of second to fourth harmonics. Typically, it is desirable to use the second harmonic (532 nm) or the third harmonic (355 nm) of a YAG laser (the fundamental wave, 1064 nm). For example, laser light emitted from a continuous wave YAG laser is converted into a harmonic by a non-linear optical element and the semiconductor film 502 is irradiated therewith. The power density may be approximately in the range of 0.01 $MW/cm^2$ to 100 $MW/cm^2$ (preferably 0.1 $MW/cm^2$ to 10 $MW/cm^2$).

By irradiating the semiconductor film 502 with the laser light 503 as described above, a crystalline semiconductor film 504 in which crystallinity is further enhanced is formed.

Before the crystallization with the laser light 503, a crystallization step using a catalytic element may be provided. Nickel (Ni) is used as the catalytic element; however, another element such as germanium (Ge), iron (Fe), palladium (Pd), tin (Sn), lead (Pb), cobalt (Co), platinum (Pt), copper (Cu), or gold (Au) can be used.

If the crystallization step with the laser light is performed after the crystallization step using the catalytic element, a crystal formed at the time of the crystallization using the catalytic element remains on a side closer to the substrate without being melted by laser light irradiation. Crystallization is promoted using the crystal as a crystal nucleus. Therefore, the crystallization with laser light irradiation easily proceeds uniformly from a substrate side to the surface of the semiconductor film. As compared to the case of performing only the crystallization step with the laser light, crystallinity of the semiconductor film can be more improved and roughness of the surface of the semiconductor film after the crystallization with the laser light can be suppressed. Therefore, variations in characteristics of a semiconductor element, typically, a TFT to be formed later can be suppressed.

Note that, after crystallization is promoted by adding the catalytic element and performing the heat treatment, crystallinity may be further improved by laser light irradiation. Alternatively, the step of the heat treatment may be omitted. Specifically, after adding the catalytic element, the laser light irradiation may be performed instead of the heat treatment to improve crystallinity.

The catalytic element may be introduced to an entire surface of the semiconductor film or into a part of the semiconductor film, and then, crystal growth may be performed. When the catalytic element is introduced into a part of the semiconductor film, the crystal growth proceeds from the introduced region in a direction parallel to the substrate.

Note that the catalytic element (here, nickel) remains in the crystalline semiconductor film obtained using the catalytic element. Although it is not uniformly dispersed in the film, it remains at a concentration of more than $1 \times 10^{19}/cm^3$ on an average. Even in such a condition, various semiconductor devices in addition to the TFT can be formed, but a more reliable semiconductor device can be obtained by removing the element with a gettering method. Hereinafter described is a method for adding a catalytic element, crystallizing by heating, improving crystallinity by laser light irradiation, and removing the catalytic element by gettering from a crystalline semiconductor film in which crystallinity is improved.

First, a nickel acetate solution including a catalytic metal element which promotes crystallization (here, nickel) of 1 ppm to 100 ppm by weight is applied with a spinner to the surface of the semiconductor film 502 to form a nickel-containing layer. As another method other than the method for forming a nickel-containing layer by application, a method for forming an extremely thin film by a sputtering method, an evaporation method, or plasma treatment may be employed. Although the example of entirely applying is described here, a mask may be formed to form a nickel-containing layer in a part of the semiconductor film 502.

Next, heat treatment is performed for crystallization. In this case, the crystallization proceeds with silicide formed as a nucleus in a region of the semiconductor film in contact with the metal element which promotes crystallization of a semiconductor. In this way, a semiconductor film having a crystalline structure is formed. Note that an oxygen concentration in the semiconductor film after the crystallization is preferably $5 \times 10^{18}/cm^3$ or less. Here, the heat treatment (550° C. to 650° C. for 4 to 24 hours) for crystallization is performed after heat treatment (500° C. for one hour) for dehydrogenation. In the case of performing the crystallization by intense light irradiation, any one of infrared light, visible light, and ultraviolet light, or a combination thereof can be used. If necessary, heat treatment may be performed for releasing hydrogen contained in a semiconductor film having an amorphous structure before the intense light irradiation. Alternatively, the crystallization may be performed by simultaneously performing the heat treatment and the intense light irradiation. In consideration of productivity, it is preferable to perform crystallization by intense light irradiation.

Subsequently, a native oxide film formed in the crystallization step is removed. Since this native oxide film contains a catalytic element (in this embodiment, nickel) at high concentration, the native oxide film is preferably removed.

Next, in order to increase a crystallization ratio (ratio of a volume of crystal component to the whole volume of the film) and repair defects remaining in crystal grains, the crystalline semiconductor film is irradiated with laser light. By laser light irradiation, a distortion or a ridge is formed in the semiconductor film, and a thin surface oxide film (not shown) is formed on the surface of the semiconductor film. This laser light irradiation may be performed using the laser treatment apparatus described in Embodiment Mode.

Next, first heat treatment for reducing a distortion of the crystalline semiconductor film (heat treatment of heating the semiconductor film instantaneously to approximately 400° C. to 1000° C.) is performed in a nitrogen atmosphere to obtain a flat semiconductor film. The heat treatment of instantaneously heating may be performed by irradiating with intense light or putting a substrate into a heated gas and taking the substrate out after being left for several minutes. Depending on conditions of this heat treatment, a defect remaining in a crystal grain can be repaired, in other words, crystallinity can be improved while reducing the distortion. In addition, this heat treatment reduces the distortion, so that nickel is easily gettered in a subsequent gettering step. When the temperature in this heat treatment is lower than that in crystallization, nickel moves into the semiconductor film with the film in a solid phase.

Then, a semiconductor film containing a rare gas element is formed over the crystalline semiconductor film. Before forming the semiconductor film containing a rare gas element, an oxide film to serve as an etching stopper (referred to as a barrier layer) may be formed to have a thickness of 1 nm to 10 nm. The barrier layer may be formed simultaneously by the heat treatment for reducing the distortion of the semiconductor film.

The semiconductor film containing a rare gas element is formed by a plasma CVD (PCVD) method or a sputtering method to form a gettering site with a thickness of 10 nm to 300 nm. As the rare gas element, one or more of helium (He), neon (Ne), argon (Ar), krypton (Kr), and xenon (Xe) are used. Above all, argon (Ar) that is an inexpensive gas is preferable.

Here, the semiconductor film containing a rare gas element is formed by a PCVD method using monosilane and argon as a material gas at a ratio (monosilane:argon) of 0.1:99.9 to 1:9, preferably, 1:99 to 5:95. An RF power density during the deposition is preferably in the range of 0.0017 W/cm$^2$ to 0.48 W/cm$^2$. When the RF power density is high, the quality of the film is improved enough to obtain a gettering effect and a deposition rate is improved. In addition, a pressure during the deposition is preferably in the range of 1.333 Pa to 133.322 Pa. Higher the pressure is, the more the deposition rate is improved. However, when the pressure is high, an Ar concentration in the film is decreased. A deposition temperature is preferably in the range of 300° C. to 500° C. In this way, the semiconductor film can be formed by a PCVD method, which contains argon at a concentration of $1 \times 10^{18}$/cm$^3$ to $1 \times 10^{22}$/cm$^3$, preferably, $1 \times 10^{20}$/cm$^3$ to $1 \times 10^{21}$/cm$^3$. By adjusting deposition conditions for the semiconductor film within the above-described ranges, damage to the barrier layer during the deposition can be reduced, so that variations in the thickness of the semiconductor film and defects of holes formed in the semiconductor film can be prevented.

Ions of the rare gas element that is an inert gas contained in the film have two purposes. One is to form a dangling bond to provide the semiconductor film with a distortion, and the other is to provide distortions among lattices of the semiconductor film. In order to provide distortions among the lattices of the semiconductor film, it is remarkably effective to use an element having a larger atomic radius than silicon, such as argon (Ar), krypton (Kr), or xenon (Xe). In addition, the rare gas element contained in the film forms not only a lattice distortion but also a dangling bond, which contributes to gettering.

Next, heat treatment is conducted to perform gettering for reducing a concentration of the metal element (nickel) in the crystalline semiconductor film or to remove the metal element. The heat treatment for gettering may be performed by irradiating with intense light, using a furnace, or putting a substrate into a heated gas and taking the substrate out after being left for several minutes. Here, second heat treatment for gettering (heat treatment of heating the semiconductor film instantaneously to approximately 400° C. to 1000° C.) is performed in a nitrogen atmosphere.

With this second heat treatment, the metal element moves into the semiconductor film containing a rare gas element to remove the metal element contained in the crystalline semiconductor film covered with the barrier layer or to reduce a concentration of the metal element. The metal element contained in the crystalline semiconductor film moves in a direction perpendicular to the substrate surface and toward the semiconductor film containing a rare gas element.

The moving distance of the metal element at the time of the gettering may be approximately equivalent to a thickness of the crystalline semiconductor film; thus, gettering can be completed in a relatively short time. Here, the gettering is fully performed so that nickel is all moved to the semiconductor film containing a rare gas element to prevent nickel from segregating in the crystalline semiconductor film, and almost no nickel is contained in the crystalline semiconductor film, in other words, a nickel concentration in the film is in the range of $1 \times 10^{18}$/cm$^3$ or less, preferably, $1 \times 10^{17}$/cm$^3$ or less. Note that not only the semiconductor film containing a rare gas element but also the barrier layer functions as the gettering site.

Next, only the semiconductor film containing a rare gas element is selectively removed using the barrier layer as an etching stopper. Only the semiconductor film containing a rare gas element can be selectively etched by dry etching with ClF$_3$ without the use of plasma or wet etching using an alkali solution such as a water solution containing hydrazine or tetramethyl ammonium hydroxide (chemical formula: (CH$_3$)$_4$NOH) (abbr.: TMAH). Note that overetching is performed for a shorter time in order to prevent a pin hole from being formed in the crystalline semiconductor film during this etching.

Next, the barrier layer is removed using an etchant including hydrofluoric acid.

Before forming the semiconductor film containing a rare gas element, flushing treatment may be performed using a flush material to remove an impurity such as F in a chambel Monosilane is used as the flush material to coat an inner wall of the chamber by keeping monosilane being introduced into the chamber at a gas flow ratio of 8 SLM to 10 SLM for 5 to 20 minutes, preferably, 10 to 15 minutes. Thus, treatment for preventing an impurity from attaching to the substrate (also referred to flushing treatment or silane flush) is performed. Note that 1 SLM is equivalent to 1000 sccm, in other words, 0.06 m$^3$/h.

The above-described process can provide a favorable crystalline semiconductor film in which a metal element is reduced. Particularly when an active layer of a TFT is formed using such a crystalline semiconductor film, an off-current in the TFT can be suppressed by performing gettering.

Next, the crystalline semiconductor film 504 is patterned to form island-shaped semiconductor films 507 to 509 as shown in FIG. 4C. These island-shaped semiconductor films 507 to 509 serve as active layers of TFTs to be formed in subsequent steps.

Next, an impurity is introduced into the island-shaped semiconductor films to control a threshold. In this embodiment, boron (B) is introduced into the island-shaped semiconductor films by adding diborane (B$_2$H$_6$).

Next, an insulating film 510 is formed to cover the island-shaped semiconductor films 507 to 509. The insulating film 510 can be formed using, for example, silicon oxide (SiO), silicon nitride (SiN), silicon oxide containing nitrogen (SiON), or the like. In addition, the insulating film 510 can be formed by a plasma CVD method, a sputtering method, or the like.

Next, a conductive film is formed over the insulating film 510 and then patterned to form gate electrodes 570 to 572.

The gate electrodes 570 to 572 are formed using a single layer of a conductive film or a laminated layer of two or more conductive films. In the case of laminating two or more conductive films, the gate electrodes 570 to 572 may be formed by laminating an element selected from tantalum (Ta), tungsten (W), titanium (Ti), molybdenum (Mo), and aluminum (Al), an alloy or a compound containing the element as its main component. Alternatively, the gate electrodes may be formed using a semiconductor film typified by a polycrystalline silicon film doped with an impurity element such as phosphorus (P).

Figure 4D:
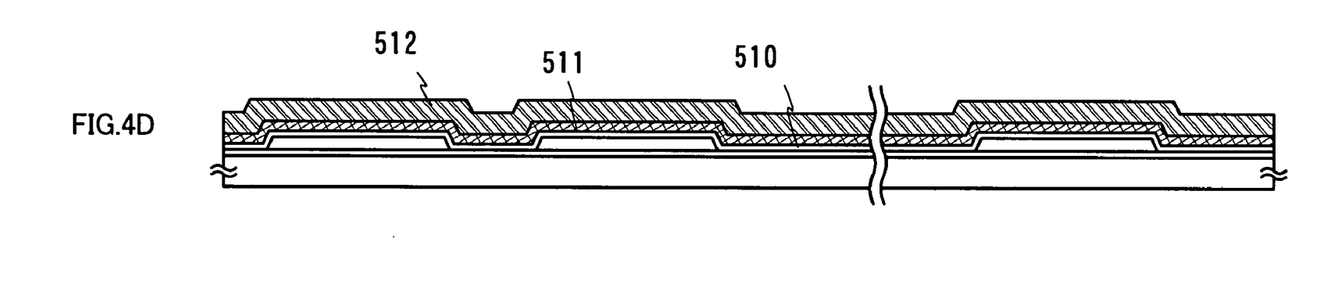

In this embodiment, the gate electrodes 570 to 572 are formed as follows. First, for example, a tantalum nitride (TaN) film is formed as a first conductive film 511 over the insulating film 511 to have a thickness of 10 nm to 50 nm, for example, 30 nm. Then, for example, a tungsten (W) film is formed as a second conductive film 512 over the first conductive film 511 to have a thickness of 200 nm to 400 nm, for example, 370 nm. Accordingly, a laminated film of the first conductive film 511 and the second conductive film 512 is formed (FIG. 4D).

Figure 5A:
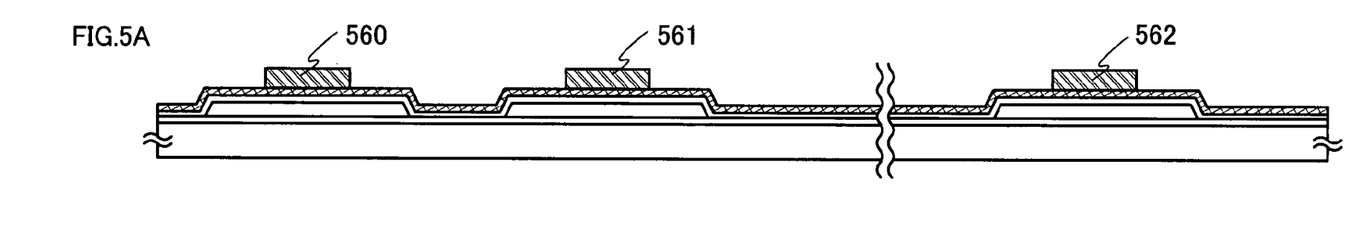
FIGS. 5A to 5C show a manufacturing process of a semiconductor device of the present invention.
Figure 5B:
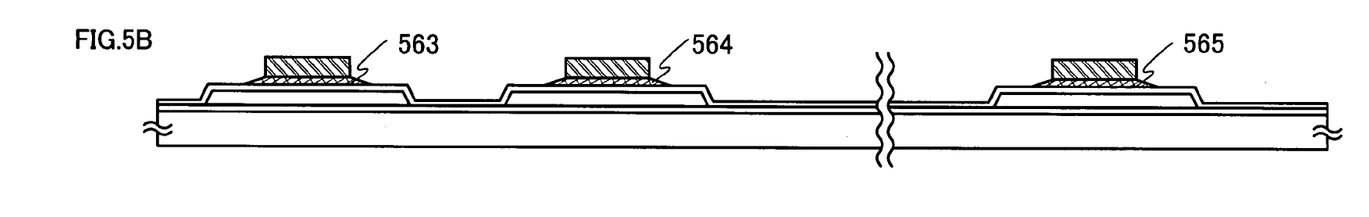
Figure 5C:
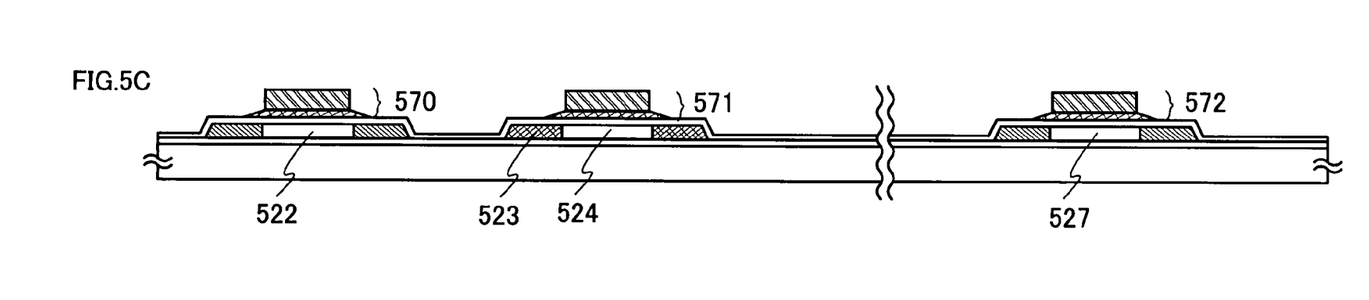

Next, the first conductive film 511 is anisotropically etched to form upper gate electrodes 560 to 562 (FIG. 5A). Then, the second conductive film 512 is isotropically etched to form lower gate electrodes 563 to 565 (FIG. 5B). Accordingly, the gate electrodes 570 to 572 are formed.

The gate electrodes 570 to 572 may be formed as a part of a gate wiring. Alternatively, a gate wiring may be separately formed and the gate electrodes 570 to 572 may be connected to the gate wiring.

Then, each of the island-shaped semiconductor films 507 to 509 is doped with an impurity which imparts one conductivity (n-type or p-type conductivity) using the gate electrodes 570 to 572 or a patterned resist as a mask, thereby forming a source region, a drain region, a low-concentration impurity region, and the like.

First, phosphorus (P) is introduced into the island-shaped semiconductor films using phosphine ($PH_3$) at an applied voltage of 60 keV to 120 keV and with a dose amount of $1 \times 10^{13}$ $cm^{-2}$ to $1 \times 10^{15}$ $cm^{-2}$. At this time of impurity introduction, channel formation regions 522 and 527 of n-channel TFTs 550 and 552 are formed.

In order to manufacture a p-channel TFT 551, boron (B) is introduced into the island-shaped semiconductor films using diborane ($B_2H_6$) at an applied voltage of 60 keV to 100 keV, for example, 80 keV and with a dose amount of $1 \times 10^{13}$ $cm^{-2}$ to $5 \times 10^{15}$ $cm^{-2}$, for example, $3 \times 10^{15}$ $cm^{-2}$. With this step, a source or drain region 523 of the p-channel TFT, and a channel formation region 524 are formed at this time of impurity introduction.

Subsequently, the insulating film 510 is patterned to form gate insulating films 580 to 582.

Figure 6A:
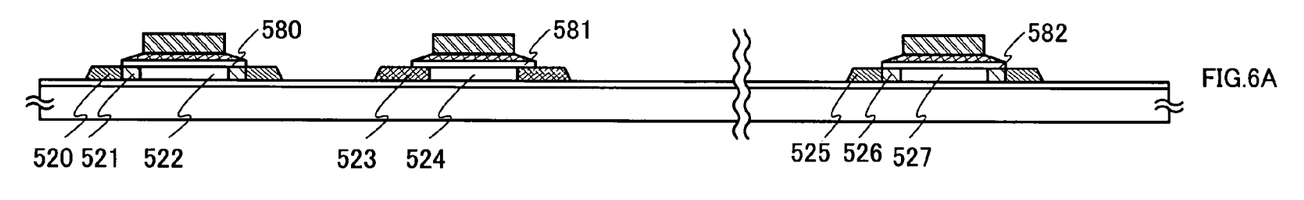
FIGS. 6A to 6C show a manufacturing process of a semiconductor device of the present invention.

After forming the gate insulating films 580 to 582, phosphorus (P) is introduced into the island-shaped semiconductor films of the n-channel TFTs 550 and 552 using phosphine ($PH_3$) at an applied voltage of 40 keV to 80 keV, for example, 50 keV and with a dose amount of $1.0 \times 10^{15}$ $cm^{-2}$ to $2.5 \times 10^{16}$ $cm^{-2}$, for example, $3.0 \times 10^{15}$ $cm^{-2}$. With this step, low-concentration impurity regions 521 and 526 and source or drain regions 520 and 525 of the n-channel TFTs are formed (FIG. 6A).

In this embodiment, phosphorus (P) is contained in each of the source or drain regions 520 and 525 of the n-channel TFTs 550 and 552 at a concentration of $1 \times 10^{19}$ $cm^{-3}$ to $5 \times 10^{21}$ $cm^{-3}$. Moreover, phosphorus (P) is contained in each of the low-concentration impurity regions 521 and 526 of the n-channel TFTs 550 and 552 at a concentration of $1 \times 10^{18}$ $cm^{-3}$ to $5 \times 10^{19}$ $cm^{-3}$. Further, boron (B) is contained in the source or drain region 523 of the p-channel TFT 551 at a concentration of $1 \times 10^{19}$ $cm^{-3}$ to $5 \times 10^{21}$ $cm^{-3}$.

Figure 6B:
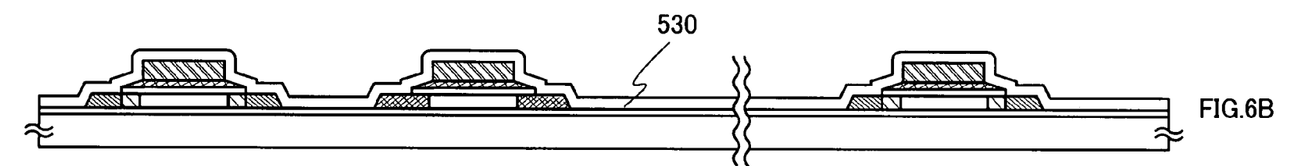

Next, a first interlayer insulating film 530 is formed to cover the island-shaped semiconductor films 507 to 509, the gate insulating films 580 to 582, and the gate electrodes 570 to 572 (FIG. 6B).

The first interlayer insulating film 530 is formed by a plasma CVD method or a sputtering method using an insulating film containing silicon such as a silicon oxide film (SiO film), a silicon nitride film (SiN film), or a silicon oxide film containing nitrogen (SiON film) or a laminated film thereof. Naturally, the first interlayer insulating film 530 is not limited to the silicon oxide film containing nitrogen, the silicon nitride film, or the laminated film thereof, and a single layer of another insulating film containing silicon or a laminated layer thereof may be used.

In this embodiment, after introducing the impurity, a silicon oxide film containing nitrogen (SiON film) is formed with a thickness of 50 nm by a plasma CVD method, and then the impurity may be activated by the laser irradiation method using the laser treatment apparatus described in Embodiment Mode or by another laser irradiation method. Alternatively, after forming the silicon oxide film containing nitrogen, heat treatment may be performed at 550° C. for four hours in a nitrogen atmosphere to activate the impurity.

Next, a silicon nitride film (SiN film) is formed with a thickness of 50 nm and a silicon oxide film containing nitrogen (SiON film) is then formed with a thickness of 600 nm by a plasma CVD method. This laminated film of the silicon oxide film containing nitrogen, the silicon nitride film, and the silicon oxide film containing nitrogen corresponds to the first interlayer insulating film 530.

Subsequently, hydrogenation is performed by heating the whole at 410° C. for one hour to release hydrogen from the silicon nitride film.

Figure 6C:
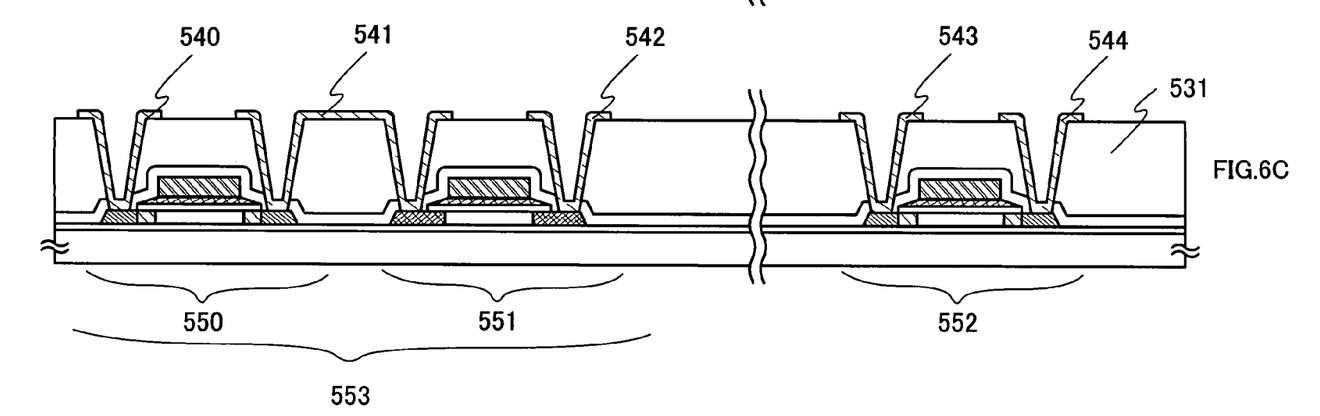

Next, a second interlayer insulating film 531 serving as a planarizing film is formed to cover the first interlayer insulating film 530.

The second interlayer insulating film 531 can be formed using a photosensitive or non-photosensitive organic material (polyimide, acrylic, polyamide, polyimide amide, resist, or benzocyclobutene), siloxane, or a laminated layer thereof. As the organic material, a positive or negative photosensitive organic resin can be used.

Note that siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents.

In this embodiment, the second interlayer insulating film 531 is formed using siloxane by a spin coating method.

A third interlayer insulating film may be formed over the second interlayer insulating film 531. As the third interlayer insulating film, a film which transmits less moisture, oxygen, and the like than other insulating films is used. Typically, a silicon nitride film, a silicon oxide film, a silicon nitride film containing oxygen (a SiNO film (composition ratio: N>O) or a SiON film (composition ratio: N<O)), a thin film mainly containing carbon (for example, a DLC film or a CN film), or the like, which can be formed by a sputtering method or a CVD method, can be used. When the intrusion of moisture, oxygen, and the like does not become a problem, the third interlayer insulating film is not necessarily formed.

The first interlayer insulating film 530 and the second interlayer insulating film 531 are etched to form contact holes that reach the island-shaped semiconductor films 507 to 509 in the first interlayer insulating film 530 and the second interlayer insulating film 531.

A first conductive film is formed over the second interlayer insulating film 531 with the contact holes, and the first conductive film is then patterned to form electrodes or wirings 540 to 544.

In this embodiment, a metal film is used as the first conductive film. The metal film may be a film containing an element of aluminum (Al), titanium (Ti), molybdenum (Mo), tungsten (W), and silicon (Si) or an alloy film using these elements. In this embodiment, a titanium film (Ti), a titanium nitride film (TiN), a silicon-aluminum alloy film (Al—Si), and a titanium film (Ti) having thicknesses of 60 nm, 40 nm, 300 nm, and 100 nm, respectively, are sequentially laminated and then patterned and etched into desired shapes to form the electrodes or wirings 540 to 544.

These electrodes or wirings 540 to 544 may be formed with an aluminum alloy film containing carbon and at least one element of nickel, cobalt, and iron. Such an aluminum alloy film can prevent mutual diffusion of silicon and aluminum even when the aluminum alloy film is in contact with silicon. Further, since an oxidation-reduction reaction does not occur even when such an aluminum alloy film is in contact with a transparent conductive film such as an ITO (Indium Tin Oxide) film, both can be directly in contact with each other. Moreover, such an aluminum alloy film has low specific resistance and superior heat resistance; therefore, the aluminum alloy film is effective as a wiring material.

The electrodes or wirings 540 to 544 may be formed by integrating an electrode and a wiring with each other. Alternatively, the electrode and the wiring which are formed separately may be connected.

With a series of the steps, a semiconductor device including the n-channel TFTs 550 and 552 and the p-channel TFT 551 can be formed. In addition, the n-channel TFT 550 and the p-channel TFT 551 constitutes a CMOS circuit 553.

A method for manufacturing a semiconductor device of the present invention is not limited to the above-described manufacturing steps after forming the island-shaped semiconductor films. By using the island-shaped semiconductor films which are crystallized by the laser irradiation method of the invention as an active layer of the TFT, variations in mobility, threshold voltage, and on-current among elements can be suppressed.

Moreover, this embodiment can be freely combined with any description in Embodiment Mode if necessary.

In the embodiment, a semiconductor device can be safely manufactured while preventing a disaster by using the laser treatment apparatus of the invention and the laser irradiation method using the apparatus.

Embodiment 2

Figure 7A:
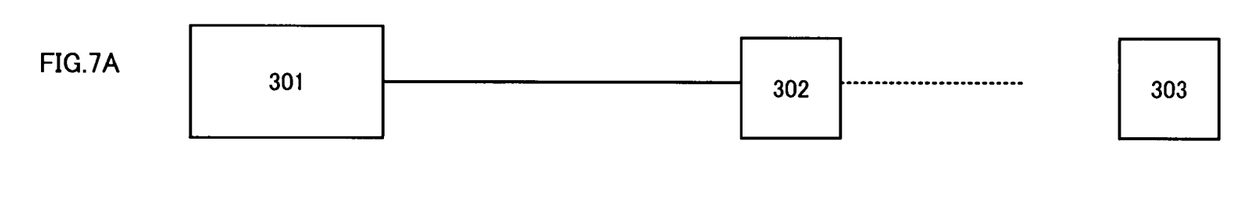
FIGS. 7A and 7B show a laser treatment apparatus of the present invention.
Figure 7B:
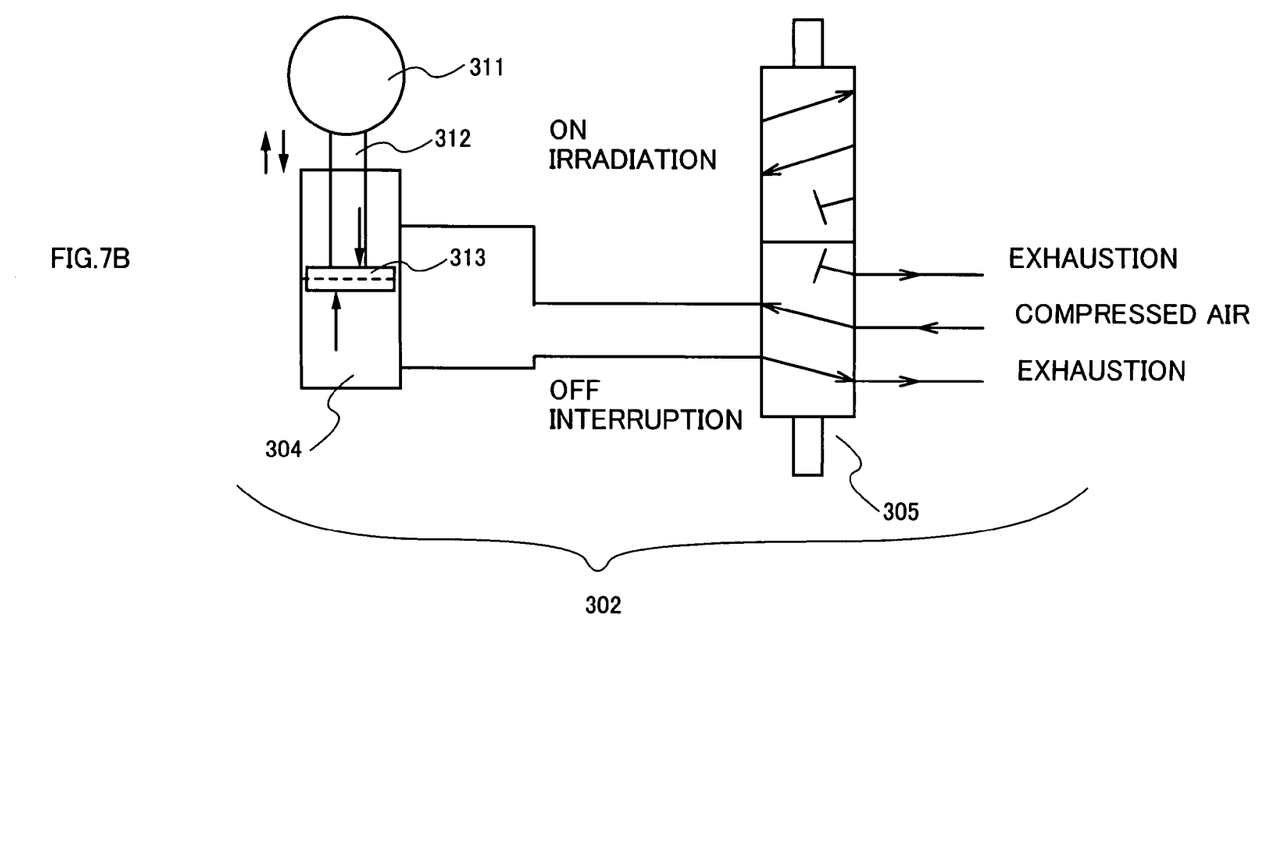

In this embodiment, a method for stopping laser irradiation, which is different from that described in Embodiment 1, is explained with reference to FIG. 7A to FIG. 7B.

If a movable table 303 operates normally, a substrate over the movable table 303 is irradiated with a linear laser which is outputted from a laser oscillator 301.

If the movable table 303 is in an abnormal situation, conduction between contacts of a timer is blocked as in Embodiment 1. This embodiment differs from Embodiment 1 in that an electromagnetic shutter 302 connected to the timer is provided between the laser oscillator 301 and the movable table 303, and at the time of abnormal movement of the movable table 303, the electromagnetic shutter 302 interrupts an optical path of the linear laser so as not to irradiate a portion other than the movable table 303 with the linear laser (FIG. 7A).

The electromagnetic shutter 302 includes an air cylinder 304 and a solenoid valve 305. An end of the air cylinder 304 is provided with an interrupting portion 311 for interrupting the linear laser, which is connected with a piston rod 312. The inside of the air cylinder 304 is separated into two: an upper portion and a lower portion. When compressed air is introduced into the upper portion and gas in the lower portion is expelled through the solenoid valve 305, the piston rod 312 goes down and the interrupting portion 311 interrupts the linear laser. On the other hand, when compressed air is introduced into the lower portion of the air cylinder 304 and gas in the upper portion is expelled through the solenoid valve 305, the piston rode 312 goes up and irradiation with the linear laser is performed (FIG. 7B).

Note that it is preferable to set the interrupting portion 311 to be able to interrupt laser light in a low position because an interrupted state can be maintained even when pressure of compressed air is decreased.

The solenoid valve 305 is electrically connected to the timer. When conduction between contacts of the timer is blocked, the solenoid valve 305 is put in an off state, and compressed air in the lower portion is expelled through the solenoid valve 305. Then, the piston rod 312 goes down and the interrupting portion 311 interrupts the linear laser. Accordingly, even when the movable table 303 is put in an abnormal condition, an unintended portion is not irradiated with the linear laser and a disaster such as a fire can be prevented.

By using the present invention, laser output can be automatically stopped even when a laser treatment apparatus is abnormally stopped due to an unusual situation, and a disaster such as a fire can be prevented. In addition, the invention is effective also in manufacturing a semiconductor device by using the laser treatment apparatus of the invention because the laser treatment apparatus of the invention can be safely handled.

What is claimed is:

1. A laser treatment method, using a laser treatment apparatus including a laser oscillator, a first interlock provided in the laser oscillator, a movable table which moves with a certain movement period, a timer, a second interlock provided in the timer, and a sensor which can detect movement of the movable table, the method comprising:
   placing a substrate over the movable table;
   annealing a semiconductor film formed over the substrate with laser light;
   starting measuring time with the timer when the sensor senses passage of the movable table; and
   blocking conduction between contacts of the second interlock provided in the timer when the movable table does not pass the sensor even after the movement period to operate the first interlock in the laser oscillator, thereby not irradiating the substrate over the movable table with the laser light.

2. A method according to claim 1, wherein the laser is a continuous wave laser.

3. A method according to claim 2, wherein the continuous wave laser is any one of an Ar laser, a Kr laser, a $CO_2$ laser, a YAG laser, a YVO$_4$ laser, a YLF laser, a YAIO$_3$ laser, a GdVO$_4$ laser, a Y$_2$O$_3$ laser, a ruby laser, an alexandrite laser, a Ti:sapphire laser, and a helium-cadmium laser.

4. A method according to claim 1, wherein the laser is a pulsed laser with a frequency of 10 MHz or more.

5. A method according to claim 4, wherein the pulsed laser is any one of an Ar laser, a Kr laser, an excimer laser, a CO$_2$ laser, a YAG laser, a Y$_2$O$_3$ laser, a YVO$_4$ laser, a YLF laser, a YAIO$_3$ laser, a GdVO$_4$ laser, a glass laser, a ruby laser, an alexandrite laser, a Ti:sapphire laser, a copper vapor laser, and a gold vapor laser.

6. A method according to claim 1, wherein the laser is a pulsed laser with a frequency of 80 MHz or more.

7. A method according to claim 6, wherein the pulsed laser is any one of an Ar laser, a Kr laser, an excimer laser, a CO$_2$ laser, a YAG laser, a Y$_2$O$_3$ laser, a YVO$_4$ laser, a YLF laser, a YAIO$_3$ laser, a GdVO$_4$ laser, a glass laser, a ruby laser, an alexandrite laser, a Ti:sapphire laser, a copper vapor laser, and a gold vapor laser.

8. A method for manufacturing a semiconductor device, comprising:

forming a base film over the substrate;

forming a semiconductor film over the base film;

crystallizing the semiconductor film by irradiating the semiconductor film with a linear laser by using the laser treatment method according to claim 1 to form a crystalline semiconductor film;

patterning the crystalline semiconductor film to form an island-shaped semiconductor film;

forming a gate insulating film and a gate electrode over the island-shaped semiconductor film; and adding an impurity which imparts one conductivity to the island-shaped semiconductor film to form a source region, a drain region, and a channel region.

* * * * *